United States Patent [19]

Tokura et al.

[11] Patent Number: 4,716,259

[45] Date of Patent: Dec. 29, 1987

[54] BOTH-SIDE FLEXIBLE PRINTED CIRCUIT BOARD

[75] Inventors: Go Tokura, Kanagawa; Kazuhiko Arakawa, Tokyo; Jun Terashima, Kanagawa, all of Japan

[73] Assignee: Canon Kabushiki Kaisha, Tokyo, Japan

[21] Appl. No.: 821,606

[22] Filed: Jan. 23, 1986

[30] Foreign Application Priority Data

Feb. 1, 1985 [JP] Japan ............................ 60-013096[U]

[51] Int. Cl.$^4$ .............................................. H05K 1/00
[52] U.S. Cl. .................................. 174/68.5; 361/398; 361/409
[58] Field of Search ................ 174/68.5; 361/398, 409

[56] References Cited

U.S. PATENT DOCUMENTS 2,723,635  3/1973  Smith ................................. 174/68.5

FOREIGN PATENT DOCUMENTS

| 2914336 | 11/1980 | Fed. Rep. of Germany ..... 174/68.5 |
| 605240 | 9/1981 | Japan . |
| 5748658 | 3/1982 | Japan . |
| 1241169 | 7/1971 | United Kingdom ............... 174/68.5 |

Primary Examiner—Morris H. Nimmo
Attorney, Agent, or Firm—Toren, McGeady & Associates

[57] ABSTRACT

A flexible circuit board including a substrate having at least electrically conducting patterns and electrically insulating cover layers formed on both sides thereof. A number of apertures are formed along a line in a zone at which the board is to be curved. In this zone, areas between two successive apertures having conducting patterns on the front surface do not have conducting patterns on the back surface, and further, the cover layer is applied only to the surface of the areas on which conducting patterns are formed, while the opposite surface having no patterns formed thereon is absent the cover layer.

6 Claims, 5 Drawing Figures

BOTH-SIDE FLEXIBLE PRINTED CIRCUIT BOARD

BACKGROUND OF THE INVENTION

1. Field of the Invention

This invention relates to flexible printed circuit boards having electrically conducting patterns formed on both sides thereof.

2. Description of the Prior Art

Two-sided flexible printed circuit boards, because the patterns of electrical conduction on the front and back surfaces have heretofore very often happened to coincide in place with each other across the substrate, and further because electrical elements such as IC units, resistors and condensers have been installed on each side, are more rigid than one-sided flexible printed boards.

To install the two-sided flexible printed board in a curved form, therefore, a difficult problem has arisen that the radius of curvature of the curved portion cannot be made as small as is needed. Due to the stress at, or near the curved portion being very great, no IC units, resistors or condensers can be positioned in this weakened curved portion without causing a large decrease in integrity. Also, through-holes cannot be bored therein.

If the radius of curvature of the curved portion is decreased by transferring the patterns on the back surface to the front surface, or vice versa, through-holes must be provided. Thus, another drawback is produced that the availability of a space for additional necessary lines of electrical conduction is lost.

SUMMARY OF THE INVENTION

An object of the present invention is to provide a two-sided flexible printed board which enables an equivalent curvature characteristic to that of a one-sided flexible printed circuit board to be obtained.

DETAILED DESCRIPTION OF THE PREFERRED EMBODIMENTS

Figure 1:
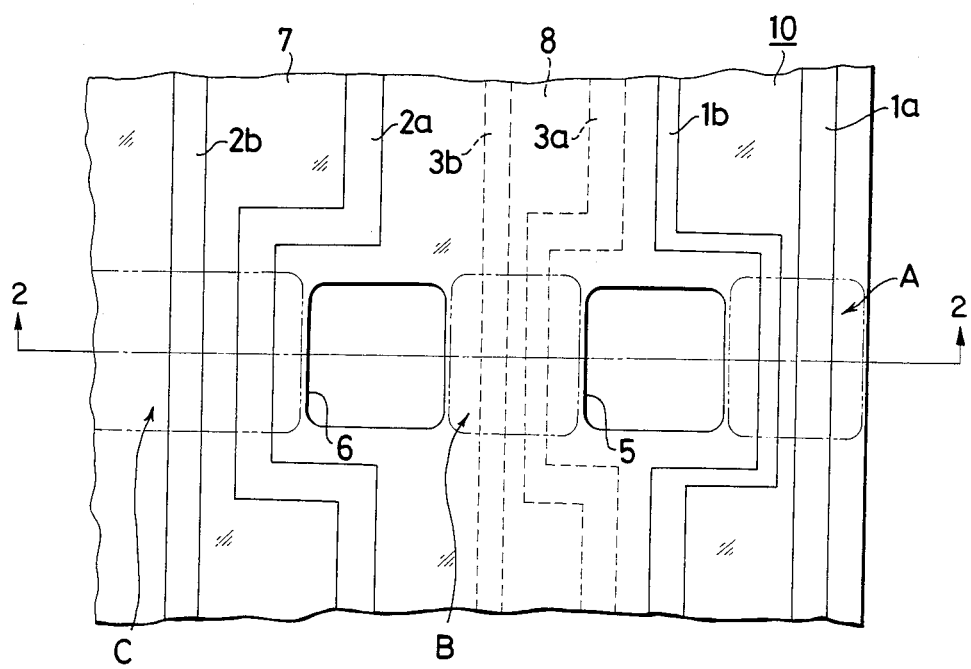
FIG. 1 is a front plan view of an embodiment of a two-sided flexible printed circuit board before being curved according to the invention.
Figure 2:
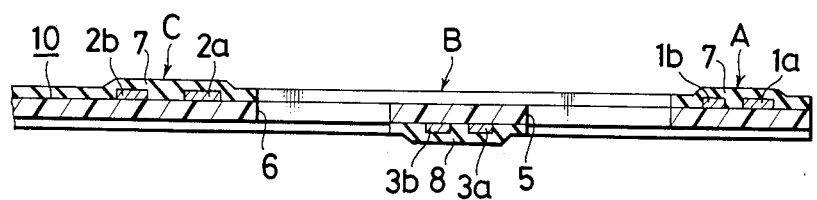
FIG. 2 is a cross-section view taken along a line 2—2 in FIG. 1 along which the board is to be curved.
Figure 3:
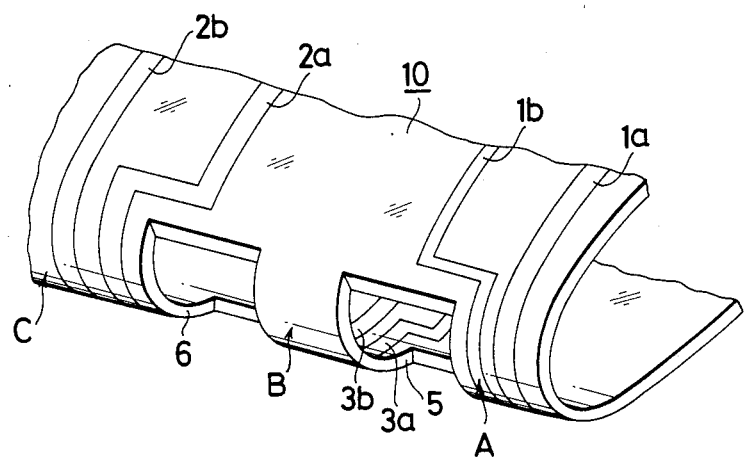
FIG. 3 is a perspective view of a curved state of the board of FIG. 1.

In FIGS. 1 to 3, there is shown one embodiment of the invention, in which a two-sided flexible printed circuit board 10 includes a thin plate (usually 0.3 mm or less in thickness) as a substrate made of synthetic resin such as polyester or polyimide. Electrically conducting patterns 1a, 1b, 2a, 2b, 3a, 3b, lie on opposite sides of the substrate. A number of apertures, in this instance, two square apertures 5 and 6, are formed in a row along a line 2—2 at which the board 10 is to be curved. Surface coating or cover layers 7 and 8, in the form of electrically insulating films, are applied on the opposite sides of the substrates.

In more detail, the electrically conducting patterns 1a, 1b, 2a and 2b are formed on a front (or upper as viewed in FIG. 1) surface of the substrate of the board 10, and the other patterns 3a and 3b are formed on a back (or lower as viewed in FIG. 1) surface. All the pairs of patterns 1a and 1b and 3a and 3b pass through respective areas between the successive two apertures 5 and 6 and are positioned such that the patterns in one of the areas lie on one surface of the substrate, while the patterns in an adjacent area lie on the other surface of the substrate. In more detail, for convenience, calling the area on the right side of the first aperture 5 in the line 2—2 a portion A, the area between the apertures 5 and 6 a portion B, and the area on the left side of the second aperture 6 a portion C, it is then in the portion A that the first pair of patterns 1a and 1b lie on the front surface, in the portion B that the third pair of patterns 3a and 3b lie on the back surface, and in the portion C that the second pair of patterns 2a and 2b lie on the front surface.

The first cover layer 7 is applied on the front surface of the substrate of the board 10, and the second cover layer 8 on the back surface. Usually, these cover layers 7 and 8 dominate all the areas of the front and back surfaces of the substrate except land portions (not shown). In the embodiment of the invention, however, the back surface of the portions A and C, or the areas enclosed within 2-dot and dash line blocks, and the front surface of the portion B, or an area enclosed within a 2-dot and dash line blocks, in other words, the portions having no patterns between the apertures, are not covered by the cover layers 7 and 8.

When the two-sided flexible printed circuit board 10 is curved along the line 2—2 as shown in FIG. 3, the curvature of the curved portion can be tightened so that it is equal to that of the one-sided flexible printed circuit board, since the electrically conducting patterns 1a to 3b and cover layers 7 and 8 are prevented from being superimposed across the substrate. This produces an advantage of quick and easy curving of the board 10 when it is to be installed.

The use of a plurality of apertures (5, 6) along a line at which the board 10 is to be curved, facilitates quickness and easiness of the curving operation. Further, even at the flat portions in the upper and lower vicinities of the apertures as viewed in FIG. 1, it becomes possible for some through-holes and some electrical elements, such as IC units, resistors or condensers, to be placed. The possibility of occurrence of accidental breaking of the patterns at the curved portions is also reduced, leading to improved fidelity.

For the board 10 of the invention, there is no need to assign only one of the surfaces to the electrically conducting patterns as wirings, and further, there is no need to use any through-holes which would otherwise be necessary for putting all the electrically conducting patterns, as the wiring, on only one of the surfaces as in the prior art. Therefore, it follows that high-density wiring also becomes possible.

The row of apertures 5, 6 has another advantage of indicating where to curve the board 10.

Figure 4:
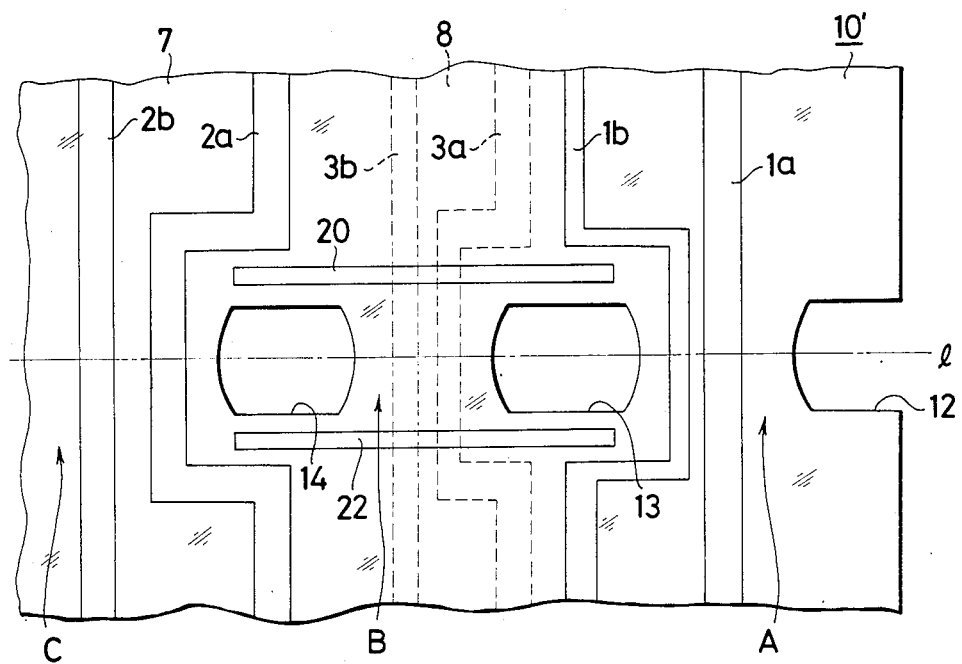
FIG. 4 is similar to FIG. 1, except that another embodiment of the invention is illustrated.

In FIG. 4 there is shown another embodiment of the invention, where the same reference characters have been employed to denote the parts similar to those shown in connection with the foregoing embodiment. Formed along the line 1 of curving the two-sided flexible printed circuit board 10' are rectangular apertures 12, 13 and 14 with their short sides slightly rounded outward. It should be noted the aperture 12 may be semi-circular, since it lies at the edge of the board 10'. The board 10' is further provided with two dummy patterns 20 and 22 parallel to the line 1 on the front surface in the vicinity of the row of apertures 13 and 14. The use of the dummy patterns 20 and 22 is aimed to improve the flatness of the board 10' in the vicinity of the apertures 13 and 14 with an advantage that the acceptable place for the through-holes and IC units may be nearer to the apertures 13 and 14.

Figure 5:
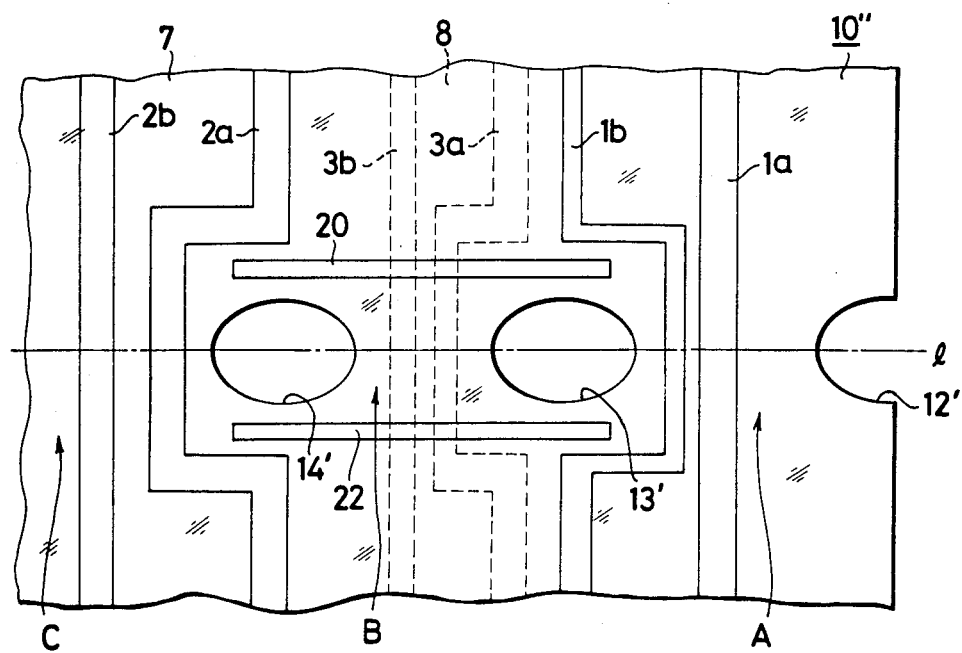
FIG. 5 is similar to FIGS. 1 and 4, except that another embodiment of the invention is illustrated.

FIG. 5 shows another embodiment of the invention, substantially similar to that shown in FIG. 4, in which the two-sided flexible printed circuit board 10" includes oval apertures 12', 13' and 14'.

The advantage of the boards 10' and 10" of FIGS. 4 and 5 are identical to those of the board 10 of FIGS. 1 to 3.

As has been described above, according to the present invention, that part of the two-sided flexible printed circuit board which is curved, can be made as flexible as the one-sided flexible printed circuit board, thereby giving an advantage of easily performing the curving operation. Another advantage arising from the improvement of the flatness in the vicinity of the apertures in the curved portion, is that the acceptable space for the through-holes and ICs or other electrical elements can be extended closer to the line at which the board is curved. A further advantage arising from the possibility of distributing the electrically conducting patterns over either side of the areas between the successive two apertures in the curved portion is that the density of wiring can be greatly increased.

It should be noted that while FIG. 1 shows square apertures, FIG. 4 shows rectangular apertures with curved sides and FIG. 5 shows oval apertures, the subject invention is not limited only to these particular shaped apertures, but rather, the apertures may be of any desired shape convenient to the manufacturing process of the two-sided printed circuit board.

We claim:

1. A two-sided flexible printed circuit board, including a substrate having electrically conducting patterns and cover layers formed on both sides, comprising:
  apertures formed in a curved portion of said printed circuit board, surface portions of said curved portion having said conducting patterns formed only on the front surface or back surface so that the conducting patterns are not superimposed one over the other in said curved portion, and said cover layers being formed only on the conducting pattern side at the surface portion of said curved portion of said board in said curved portion.

2. A two-sided flexible printed circuit board, including a substrate having electrically conducting patterns and cover layers for electrical insulation formed on both front and back surfaces of the substrate, comprising:
  (a) an area at which said board is to be curved;
  (b) a plurality of regions separated from each other by apertures formed in said area; and
  (c) each of said separated regions having said electrically conducting patterns and said cover layers both formed on only one and the same surface, front or back, of said substrate in said separated regions at least one of said separated regions having said electrically conducting patterns and said cover layers for the patterns formed on the front surface only and at least one of the other regions having said electrically conducting patterns and said cover layers for the patterns on the back surface only.

3. A two-sided flexible printed circuit board comprising a substrate having electrically conducting patterns and cover layers, overlying at least said conducting patterns, formed on both sides of said substrate, said circuit board having a zone containing a centerline about which said circuit board is to be curved, said zone containing apertures formed therethrough along said centerline, said conducting patterns being positioned, in said zone, on opposing sides of said board in portions of said board situated on opposing sides of each of said apertures along said centerline, and said portions of said board on the side opposite to said conducting patterns not being covered by said cover layers.

4. A circuit board according to claim 3, wherein said apertures are formed to an almost square shape.

5. A circuit board according to claim 3, wherein said apertures are formed to an oval shape.

6. A circuit board according to claim 3, further comprising:
  dummy patterns formed in the vicinities of said apertures almost in parallel to the centerline in said zone of said circuit board.

* * * * *